United States Patent
Zinke

[11] Patent Number: 5,837,928
[45] Date of Patent: Nov. 17, 1998

[54] THERMOELECTRIC RADIATOR

[76] Inventor: Robert D. Zinke, 12374 Greenway, Sterling Heights, Macomb County, Mich. 48312

[21] Appl. No.: 725,221

[22] Filed: Sep. 27, 1996

[51] Int. Cl.[6] .............................. H01L 35/02; H01L 35/32
[52] U.S. Cl. .................... 136/205; 136/203; 136/204; 136/208; 136/211; 136/212; 136/225; 136/242; 62/3.61
[58] Field of Search .................. 136/200, 203, 136/204, 205, 208, 211, 212, 224, 225, 242; 62/3.2, 3.3, 3.6, 3.61

[56] References Cited

U.S. PATENT DOCUMENTS

| | | | |
|---|---|---|---|
| 1,134,452 | 4/1915 | Hale | 62/3.2 |
| 1,618,743 | 2/1927 | Adams | 136/225 |
| 1,677,029 | 7/1928 | Fuller et al. | 136/211 |
| 3,817,043 | 6/1974 | Zoleta | 62/3.61 |
| 4,753,682 | 6/1988 | Cantoni | 136/212 |
| 5,547,019 | 8/1996 | Iacullo | 165/51 |

*Primary Examiner*—Kathryn L. Gorgos
*Assistant Examiner*—Chrisman D. Carroll
*Attorney, Agent, or Firm*—Peter A. Taucher; Gail S. Soderling

[57] ABSTRACT

A thermoelectric radiator for generating a direct current while providing at least a portion of the necessary cooling is formed with a first and second plurality of interdigitated thermoelectric lamella which are electrically joined and are connected to the positive and negative portions of the electrical system. The result is direct current flow when a heated coolant is passed over the lamella.

2 Claims, 2 Drawing Sheets

THERMOELECTRIC RADIATOR

The invention described herein may be made, used and licensed by or for the U.S. Government for governmental purposes without paying me any royalty.

BACKGROUND OF THE INVENTION

1. Field of the Invention

In one aspect this invention relates to cooling systems for use in land vehicles having a prime mover which must be cooled using a liquid coolant. In a further aspect, this invention relates to a method for providing electrical power to the vehicle for various uses.

2. Prior Art

In general the use of liquid coolant systems in vehicles is well known. The most common example is the ubiquitous automobile radiator. Such radiators have a closed loop cooling system wherein the liquid coolant, generally water with one or more additives, is constantly circulated while the engine, prime mover, is in operation. The passage of air through the radiator structure removes heat from the coolant and keeps the engine from overheating.

Military vehicles operate under more stressful conditions than the normal land vehicle and consequently they require superior cooling and heating parameters. In addition, they require substantial quantities of electrical power to operate a wide variety of electrical devices necessary to steer, maneuver, and fire weapons.

SUMMARY OF THE INVENTION

Briefly the present invention is an improved radiator system which can aid in cooling the prime mover and provide a source of additional electrical current. The radiator system is formed using a thermoelectric structure to provide at least a portion of the cooling and also as a source of current. The improved thermoelectric radiator structure has a first plurality of spaced lamella formed of a first thermoelectric material and a second plurality of spaced lamella formed of a second thermoelectric material. The first and second plurality of lamella are interdigitated with the first and second plurality of lamella being electrically bonded at the junctures between the lamella. A first electrical buss electrically connects all the first lamella of thermoelectric material, and a second buss electrically connects the second lamella of thermoelectric material. The first and second busses are connected to the appropriate electrical poles of the prime mover electrical system. During operation of the vehicle, the passage of heated coolant over the surfaces of the first and second lamella provides a current to the electrical system and extracts heat from the fluid flow.

DETAILED DESCRIPTION

Figure 1:
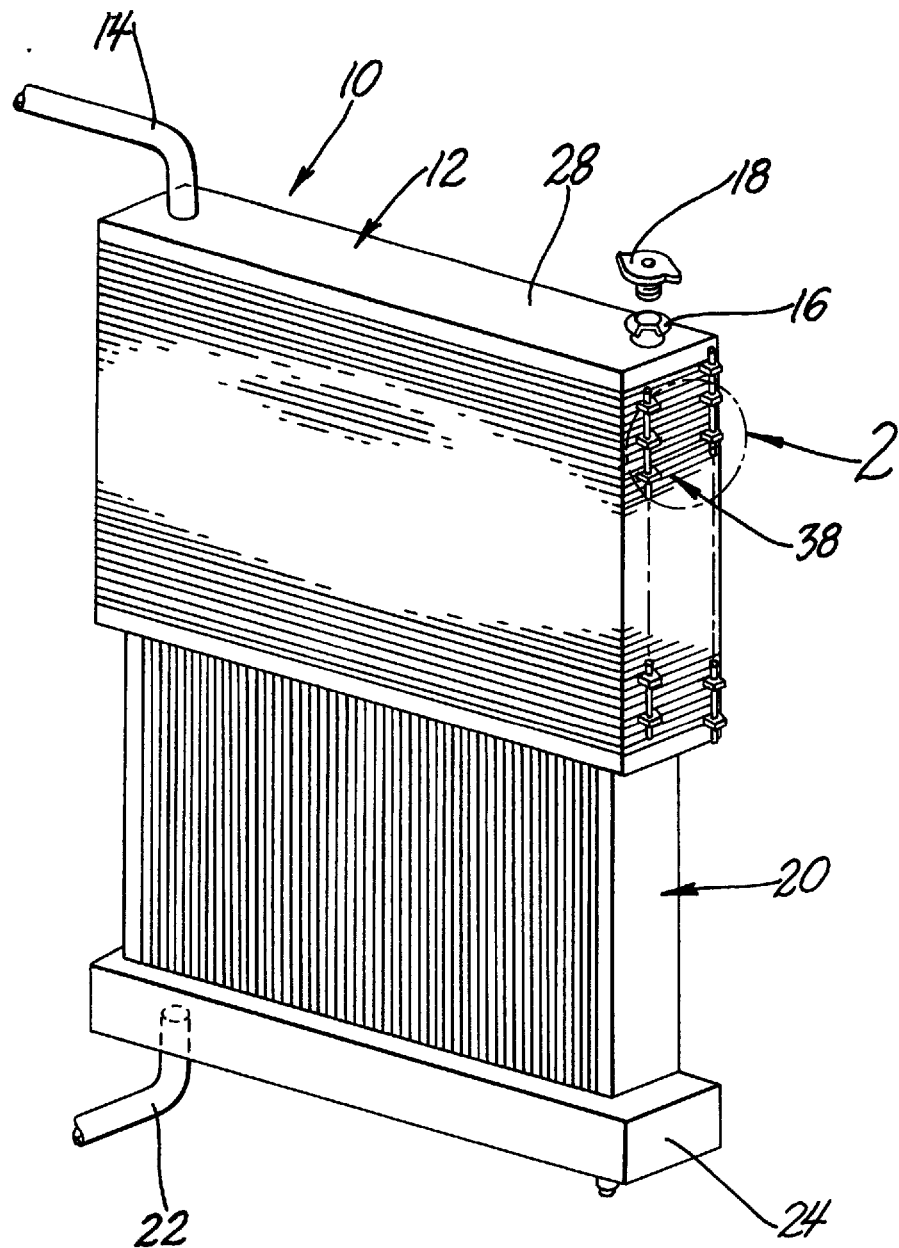
FIG. 1 is a isometric view of one embodiment of this invention.

Referring to the accompanying drawing in which like numerals refer to like parts and initially to FIG. 1, an improved radiator 10 of this invention is shown for use in a land vehicle (not shown) having a prime mover as a source of motive power. As is common with such vehicles the prime mover requires cooling, the cooling being done with a closed loop recirculating liquid coolant system. The closed loop system has a pump for circulating a liquid coolant within the closed loop system. Such cooling systems are known in the art of land vehicle design and a detailed description is omitted in the interest of brevity.

The improved radiator 10 has a thermoelectric radiator structure 12 connected to the remainder of the cooling system at an inlet 14 with a fluid fill aperture 16 sealed by a removable cap 18 which can be opened to replenish the coolant. A conventional radiator structure 20 is connected to the thermoelectric radiator 12 and is adapted to receive the coolant from the thermoelectric radiator and remove additional heat. The conventional radiator structure 20 is connected to the cooling system by outlet 22 to return the lower temperature coolant to the prime mover for further heat transfer.

The improved radiator structure 10 sits on a base 24 which can be mounted in the land vehicle using standard mounting and bracketing techniques and engineering principles. The mounting techniques are not part of this invention.

Figure 2:
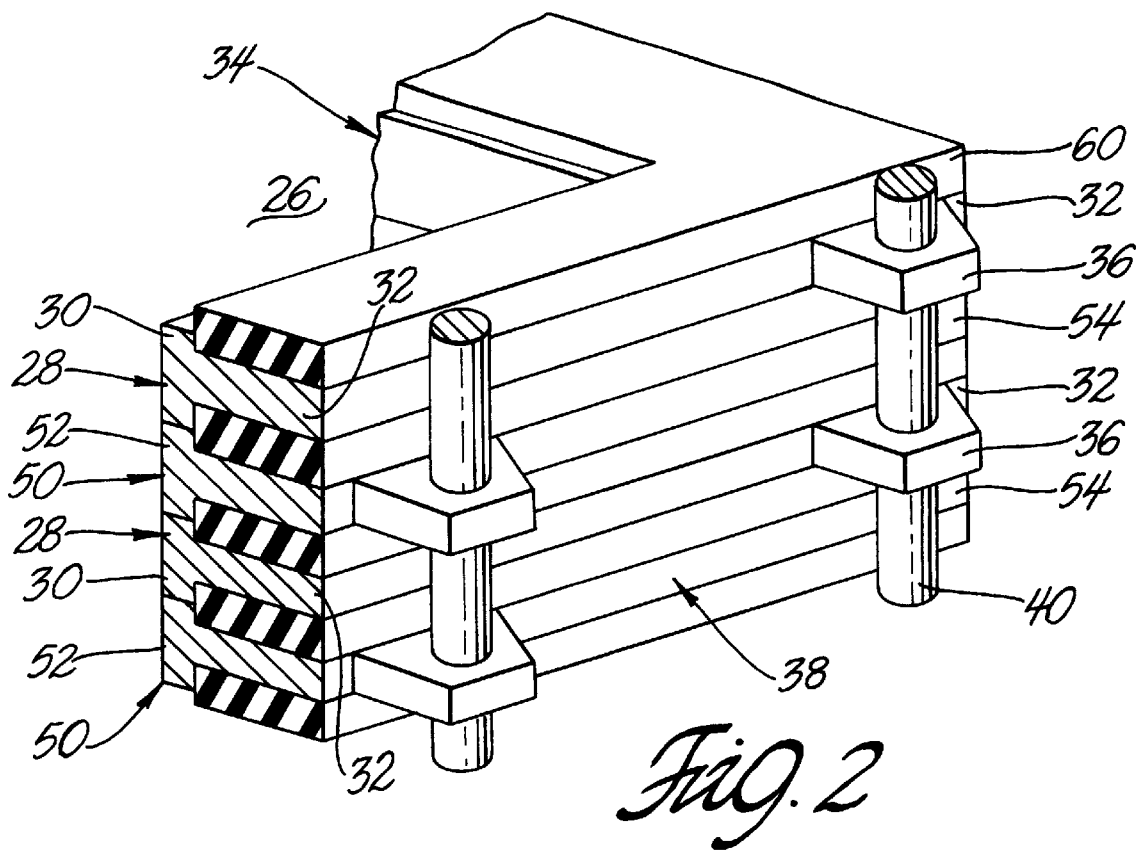
FIG. 2 is partial view in section of the structure of FIG. 1.

A portion of the thermoelectric radiator 12 is shown enlarged in FIG. 2. A chamber 26 is fluidly connected to the remainder of the closed loop liquid coolant system to receive heated coolant from the prime mover or power source as described above. The chamber 26 has an upper closure 28 shown in FIG. 1. with the inlet 14 formed therein. At the lower end of the chamber 26 is an outlet not shown to direct coolant from the thermoelectric portion 12 to the conventional radiator section 20.

The chamber 26 has at least one wall formed as a thermoelectric device to generate electric current while extracting heat from the coolant. The thermoelectric radiator 12 as detailed in FIG. 2, has a first plurality of spaced lamella 28 formed of a first thermoelectric material, the first lamella having a T-shaped cross section with cross bars 30 and legs 32. The first lamella 28 are arranged so that their cross bars 30 are aligned in a plane forming a part of the inner wall 34 of the chamber 26. The cross bars 30 are separated by a discrete distance and the legs 32 of the first lamella extend outward away from the chamber 26. Each of the legs 32 has a tab member 36 extending past the outer face 38 of the thermoelectric radiator 12. The tabs 36 are electrically connected by means of a bus 40 which provides an electrical link to all the first lamella 28. The bus 40 is connected to one pole of the vehicle electrical system. The current flow can be used to recharge the battery or provide additional power to be used on the electrical systems of the vehicle. The bus 40 is formed of a good conducting material such as a copper wire.

A second plurality of spaced lamella, 50 having a T-shaped cross section, are arranged so that their cross bars 52 are disposed coplanar with the cross bars 30 of first lamella 28 and the legs 54 of second lamella 50 extend parallel to and aligned with the legs 32 of the first lamella. The second lamella 50 are formed of a second thermoelectric material different from the first thermoelectric material. The cross bars 52 of the second lamella 50 are interdigitated with the cross bars 30 of the first plurality of lamella 28 and the juxtaposed surfaces of the cross bars 30, 52 are electrically bonded at their junctures to form an electrical couple. The joint must perforce also provide a fluid impermeable wall for the chamber 26 to contain coolant. The legs 54, 32 are separated by layers of insulating material 60.

Figure 3:
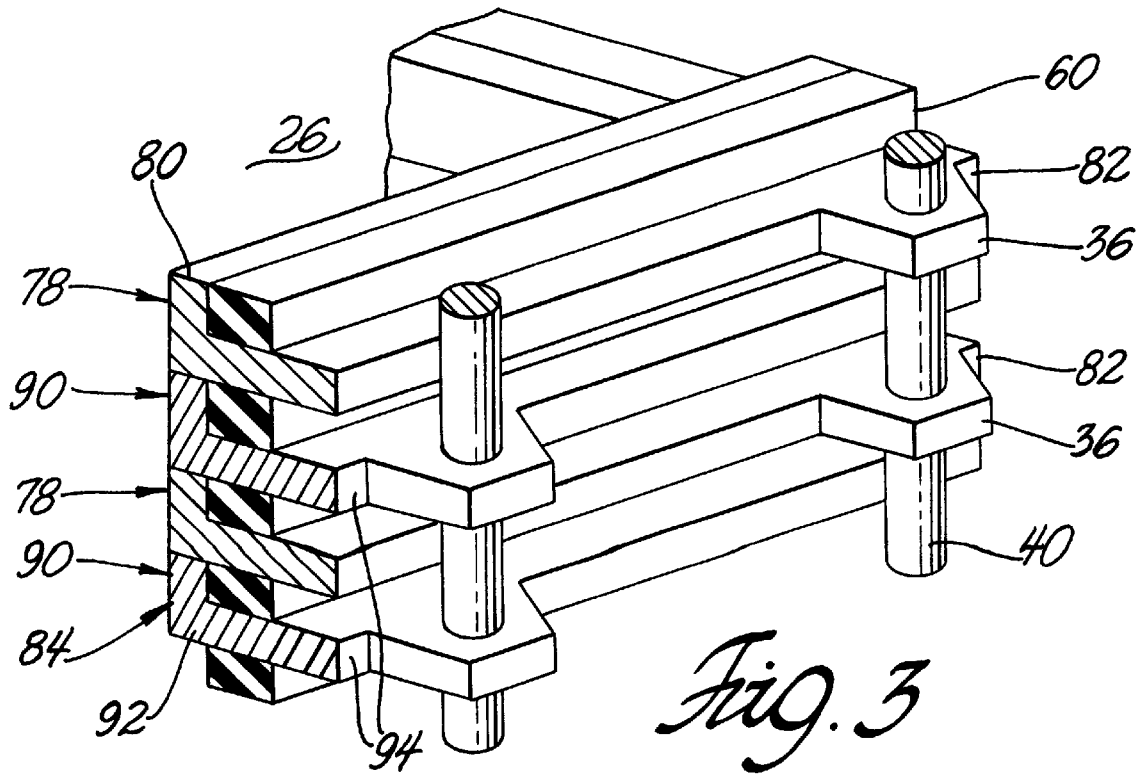
FIG. 3 is a partial view in section of a second lamellar design useful in the practice of this invention.

The lamella of FIG. 2 are shown as T-shaped however it is understood that the lamella could be formed with other cross sections. For example, FIG. 3 shows a second embodiment where the lamella are formed with an L-shaped cross section. In this embodiment chamber 26 again has at least one wall formed as a thermoelectric device. A first plurality of spaced lamella 78, are formed with the first lamella having a L-shaped cross section including arms 80 and legs 82. The first lamella 78 are arranged so that their arms 80 are aligned in a plane forming a part of the inner wall 84 of the chamber 26. The arms 80 are separated by a discrete distance and the legs 82 of the first lamella extend outward away from the chamber 26. Each of the legs 82 has a tab member 36 extending past the outer face of the thermoelectric chamber. The tabs 36 are electrically connected by means of a bus 40 which provides an electrical link to all the first lamella 78.

A second plurality of spaced lamella, 90 having an L-shaped cross section are arranged so that their arms 92 are disposed coplanar with the arms 80 of first lamella 78 and the legs 94 of second lamella 90 extend parallel to and aligned with the legs 82 of the first lamella. The second lamella 90 are formed of a second thermoelectric material different from the first thermoelectric material as described before. The arms 92 of the second lamella 90 are interdigitated with the arms 80 of the first plurality of lamella 78. The juxtaposed surfaces of the arms 80, 92 are electrically bonded at their junctures to form an electrical couple.

The first and second lamella are formed of materials which generate an electrical potential when they are electrically bonded and a temperature gradient exists between the electrically connected portion of the lamella and the nonelectrically connected portions of the lamella. For example one set of lamella can be formed from an iron material and the second set of lamella can be formed from constantin. The two sets of lamella are joined by a process which yields an electrically conductive system such as eutectic soldering. Of course the process must also yield a liquid impermeable joint.

It may be desirable to provide a plurality of insulating layers between the lamella and such an insulating layer is shown as layers 60 the insulating layers, providing a thermal barrier. The insulating layers 60 can be formed of various insulating materials such as rubber or fiberglass compounds useful at the operating temperatures of the average radiator. As shown in FIG. 3 the insulating layers do not extend to the edge of the lamella they are insulating to allow a portion of the thermoelectric material to be exposed to ambient temperature conditions. This will increase the thermal gradient and maximize the current potential.

Various alterations and modifications will become apparent to those skilled in the art without departing from the scope and spirit of this invention and it is understood this invention is limited only by the following claims.

What is claimed is:

1. An improved thermoelectric radiator structure for converting a portion of heat generated by a prime mover into useful direct current including:

a first plurality of spaced lamella, the first plurality of lamella formed of a first thermoelectric material;

a second plurality of spaced lamella, the second plurality of lamella formed of a second thermoelectric material, the second plurality of lamella being interleaved with the first plurality of lamella, the first plurality of lamella and the second plurality of lamella being electrically bonded at junctures where the first plurality and second plurality of lamella are juxtaposed;

a first electrical buss electrically connecting the first lamella of thermoelectric material, said first buss being connected to a positive electrical portion of the prime mover system; and a second buss electrically connecting the second plurality of thermoelectric material, said second buss being electrically connected to a negative portion of the prime mover electrical system; where the passage of a hot fluid over the junctures of the first and second lamella provides a current to the electrical system and extracts heat from the fluid flow.

2. An improved radiator for use in a land vehicle having a prime mover as a source of power, said prime mover being cooled with a closed loop recirculating liquid cooling system, the closed loop system having a pump for circulating a liquid coolant within the closed loop system, the improved radiator having a thermoelectric radiator structure connected to the cooling system, the thermoelectric radiator converting a portion of the heat generated by the prime mover which is contained in the recirculating liquid coolant into direct current, the improved radiator including: a chamber fluidly connected to the closed loop system, the chamber having an upper closure with an inlet formed therein, the inlet being connected to the cooling system to receive heated coolant from the prime mover and a lower closure having an outlet formed therein, a chamber formed from a first plurality of spaced lamella, said first plurality of lamella having a T-shaped cross section, each of the first plurality of lamella having a cross bar with a leg extending perpendicularly to the cross bar, the first plurality of lamella being arranged so that the cross bars of the first plurality of lamella are aligned in a plane and separated by a discrete distance with the legs of the first plurality of T-shaped lamella extending away from the chamber, the first plurality of lamella formed of a first thermoelectric material; a second plurality of spaced lamella, the second plurality of lamella having a T-shaped cross section each of the second plurality of lamella having a cross bar with a leg extending perpendicularly to the cross bar, the second plurality of lamella being arranged so that the cross bars of the second plurality of lamella are disposed coplanar with the cross bars of the first plurality of lamella and the legs of the second plurality of lamella extend parallel to, are aligned with and separated from the legs of the first plurality of lamella, the second plurality of lamella formed of a second thermoelectric material, the cross bars of the second plurality of lamella being interdigitated with and filling the discrete distance between adjoining cross bars of the first plurality of lamella, the first plurality of lamella and the second plurality of lamella being electrically bonded where the cross bars of the first and second pluralities of lamella are juxtaposed to form a fluid impermeable wall; a plurality of insulating layers, the insulating layers disposed between the legs of the first and second pluralities of lamella to provide an electrical barrier; a first electrical buss electrically connecting the first plurality of lamella of thermoelectric material, said first buss being connected to a positive portion of the prime mover electrical system and a second electrical buss electrically connecting the second plurality of lamella of thermoelectric material, said second buss being electrically connected to a negative portion of the prime mover electrical system; where the passage of a hot fluid over the impermeable wall to provide a current to the electrical system and extract heat from the fluid; and a conventional radiator structure having an inlet and an outlet, the inlet being fluidly connected to the outlet of the thermoelectric radiator, so the conventional radiator receives the liquid coolant from the thermoelectric radiator and removes additional heat from the liquid coolant, the outlet of the conventional radiator being connected to the cooling system loop.

* * * * *